United States Patent
Shinohara

(10) Patent No.: US 6,355,553 B1
(45) Date of Patent: *Mar. 12, 2002

(54) METHOD OF FORMING A METAL PLUG IN A CONTACT HOLE

(75) Inventor: Keiji Shinohara, Kanagawa (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/091,957

(22) Filed: Jul. 14, 1993

(30) Foreign Application Priority Data

Jul. 21, 1992 (JP) .............................. 4-215406

(51) Int. Cl.[7] ......................................... H01L 21/4763
(52) U.S. Cl. ........................ 438/626; 438/680; 438/685; 438/694; 438/720
(58) Field of Search ................................. 437/192, 196, 437/245, 246, 947, 228 CON, 228 SE; 148/DIG. 51, DIG. 161; 438/626, 680, 685, 694, 695, 697, 720

(56) References Cited

U.S. PATENT DOCUMENTS

| | | | |
|---|---|---|---|
| 4,617,087 A | * 10/1986 | Iyes et al. ............... | 156/643.1 |
| 4,824,802 A |    4/1989 | Brown et al. | |
| 4,876,223 A | * 10/1989 | Yoda et al. | |
| 4,879,257 A | * 11/1989 | Patrick | |
| 5,143,866 A | *  9/1992 | Matsutani ................. | 437/187 |
| 5,164,330 A | * 11/1992 | Davis et al. .............. | 437/192 |
| 5,227,337 A | *  7/1993 | Kadomura ................. | 437/192 |
| 5,231,055 A | *  7/1993 | Smith ...................... | 437/192 |
| 5,260,232 A | * 11/1993 | Muroyama et al. ........ | 437/187 |
| 5,284,804 A | *  2/1994 | Moslehi | |
| 5,527,736 A | *  6/1996 | Huang et al. | |
| 5,661,080 A | *  8/1997 | Hwang et al. | |

FOREIGN PATENT DOCUMENTS

| | | | |
|---|---|---|---|
| JP | 62-229959 | | 10/1987 |
| JP | 0414831 | * | 1/1992 |

OTHER PUBLICATIONS

Charles M. Dalton "Enhanced Selective Tungsten Encapsulation of TiW Capped Aluminum Interconnect" 1990 Proc. 7th Int. IEEE VLSI Interconnect Conf. (Jun. 1990) pp. 289–295.*
S. Wolf et al "Silicon Processing for the VLSI Era vol. I" Lattice Press (1986) p. 546 and 559–560.*
J.M.F.G. van Laarhoven et al "A Novel Blanket Tungsten Etch back Scheme" 1989 Proc. 6th Intnt'l IEEE VLSI Multilevel Interconnect Conf. (Jun. 1989) (pp. 129–135). (abstract only).*

* cited by examiner

Primary Examiner—Caridad Everhart
(74) Attorney, Agent, or Firm—Sonnenschein, Nath & Rosenthal

(57) ABSTRACT

A method of forming a metal plug, which method has the steps of depositing a metal film on an insulating film after formation of a contact opening in the insulating film and etching the metal film to bury the metal film in the contact opening, includes the steps of forming on the metal film either a smooth tungsten film formed by bias-sputtering, a smooth silicon nitride film formed by competitive reactions as etching and deposition reactions, a smooth resist film or a smoothing layer constituted by an SOG or organic polymer layer on the metal film and etching back the smooth layer or smoothing layer and the metal film under conditions in which etching rates are almost equal to each other so as to smoothly bury the metal film in the contact opening.

9 Claims, 8 Drawing Sheets

METHOD OF FORMING A METAL PLUG IN A CONTACT HOLE

BACKGROUND OF THE INVENTION

1. Field of the Invention

The present invention relates to a method of forming a metal plug in the manufacture of a semiconductor device and to a wafer processing apparatus used for forming the metal plug.

2. Description of the Prior Art

As a semiconductor device is micropatterned, the area of a contact hole is decreased, but the thickness of an interlayer insulator cannot be decreased because a high breakdown voltage must be assured. For this reason, the aspect ratio of the contact hole tends to be increased. Therefore, when a wiring layer consists of only aluminum, a disconnection easily occurs at a contact step portion due to the poor step coverage of aluminum, and the reliability of the semiconductor device is degraded.

In contrast to this, a method in which, after a contact hole is formed, a polysilicon film is deposited on the entire surface of the resultant structure, and the polysilicon film is etched back to leave the polysilicon film in only the contact hole is proposed. A so-called selective W-CVD method in which a W film is selectively formed in only the contact hole by using the reduction reaction of $WF_6$ is proposed (for example, Japanese Patent Laid-Open No. 62-229959).

Although the method of burying the contact with the polysilicon film can be realized by a prior art extension, the resistance of polysilicon itself is higher than that of a metal. In the selective W-CVD method, it is difficult to always obtain complete selectivity, and the theoretical problem that contact holes having different depths cannot be simultaneously buried with the W film is left.

A so-called blanket W-CVD method is proposed (for example, Japanese Patent Laid-Open No. 62-229959). In this blanket W-CVD method, after a contact hole is formed, a W film is deposited on the entire surface of the resultant structure, and the W film is etched back to leave the W film in only the contact hole. For this reason, the W film can be formed easier than that in the selective W-CVD method, and contact holes having different depths can be simultaneously buried with the W film.

In this blanket W-CVD method, even when a TiON layer is formed to improve the adhesion properties with the $SiO_2$ film serving as an insulating film, the contact holes can be buried with the W film. This TiON layer also functions as a barrier layer, and the melting point of W itself is high, i.e., 3,380° C. For this reason, even when the W film is formed at a relative high temperature, permeation of W into the Si substrate can be suppressed, thereby obtaining preferable electrical characteristics.

FIGS. 1A to 1C show a conventional method of forming a W plug using the above blanket W-CVD method and an etch-back technique. As shown in FIG. 1A as a state before a W plug is formed, a diffused layer 12 is formed in an Si substrate 11, and an $SiO_2$ film 13 serving as an interlayer insulator is formed on the Si substrate 11.

In this prior art, a contact hole 14 is formed in the $SiO_2$ film 13 to electrically connect with the diffused layer 12. For this purpose, a resist film (not shown) having an opening corresponding to the contact hole 14 is formed on the $SiO_2$ film 13 by photolithography, and etching is performed using the resist film as a mask by an RIE apparatus at a reaction gas flow rate of $O_2/CHF_3$=8/75 SCCM, a reaction pressure of 50 mTorr and an RF power of 1 kW.

As shown in FIG. 1B, a TiON layer 15 serving as a titanium-based material layer for improving the adhesion properties between the $SiO_2$ film 13 and a W film (to be formed later) is formed on the entire surface of the resultant structure by reactive sputtering. As the titanium-based material layer, although a TiN layer or the like may be used, a TiON layer is preferably used. Thereafter, a W film 16 is deposited on the entire surface of the resultant structure by using, e.g., a cold-wall type CVD apparatus, at a reaction temperature of 400° C., a reaction pressure of 6.5 Torr and a reaction gas flow rate ratio of $H_2/WF_6$=1/19.

The entire surface of the W film 16 is etched back with a gas such as SF6 containing fluorine, as shown in FIG. 1C, the W film 16 is left in only the contact hole 14, and the W film 16 is used as a plug. At this time, when the TiON layer 15 is etched simultaneously with the W film 16, etching back is preferably performed with a gas obtained by adding a gas such as $Cl_2$ containing chlorine to the gas containing fluorine.

As shown in FIG. 1B, however, the surface of the W film 16 has an uneven shape at the time the W film 16 is deposited. For this reason, as shown in FIG. 1C, the uneven shape is transferred to the $SiO_2$ film 13. This transfer makes it impossible to form a high-quality wiring layer on the $SiO_2$ film 13. In addition, since the surface of the W film 16 left in the contact hole 14 is kept uneven, a wiring layer formed on the $SiO_2$ film 13 cannot preferably be in electrical contact with the W film 16.

When a gas such as $SF_6$ containing fluorine is used such that ion species are not mainly used in etching but a radical reaction is mainly used in the etching, the uneven shape is prevented from being transferred to the $SiO_2$ film 13, and an etching rate is increased. However, a loading effect during etching is increased.

In over-etching after just-etching is performed to expose part of the $SiO_2$ film 13, since the etching area of the W film 16 is abruptly decreased, an etching rate of the W film 16 in the contact hole 14 is abruptly increased. For this reason, the over-etching of the W film 16 cannot be easily controlled, and as shown in FIG. 1C, the contact hole 14 is buried or filled in a recessed form.

In addition, as shown in FIG. 1C, a recessed portion 17 may be formed at the central portion of the W film 16 in the contact hole 14 because of the following reason. That is, the W film 16 is formed from the bottom surface and side surface of the contact hole 14 during the CVD, a seam 18 is formed at the central portion as shown in FIG. 1B, and the W film 16 at the seam 18 is not rigid and is brittle, thereby increasing the etching rate of the W film 16.

When the recessed portion 17 is present, the wiring layer formed on the $SiO_2$ film 13 cannot be in proper electrical contact with the W film 16. For this reason, in the prior art shown in FIGS. 1A to 1C, the reliability of a semiconductor device cannot be improved.

SUMMARY OF THE INVENTION

According to the present invention, a method of forming a metal plug, having the steps of forming a contact hole in an insulating film, depositing a metal film on the insulating film, and etching the metal film to bury the contact hole with the metal film, comprises the steps of forming a smoothing layer on the metal layer and the step of etching the smoothing layer and the metal layer as the step of etching the metal film.

As the smoothing layer, a W film formed by bias-sputtering, an $SiN_x$ (x=1 to 2) formed by competitive reactions as etching and deposition reactions, a resist film, an SOG film, an organic polymer layer or the like may be used.

In the method of forming a metal plug according to the present invention, the contact hole may be formed in a tapered shape.

A wafer processing apparatus according to the present invention comprises an organic polymer layer forming unit for forming an organic polymer layer and a heating unit for heating to fluidize the organic polymer layer to obtain a smooth organic polymer layer.

According to the present invention, a method of forming a metal plug, having the steps of forming a contact hole in an insulating film, depositing a metal film on the insulating film, and etching the metal film to bury the contact hole with the metal film, comprises the steps of performing first etching by a radical reaction as the step of etching the metal film and then performing second etching in which deposition and etching reactions of the metal layer are competitive reactions.

In the method of forming a metal plug according to the present invention, since the smoothing layer is formed on the metal layer, even when the surface of the metal film has an uneven shape at the time the metal film is deposited on the insulating film, the surface of the metal film can be smoothed during the etching by equalizing the etching rate of the smoothing layer to that of the metal film. For this reason, the uneven shape of the surface of the metal film at the time the metal film is deposited can be prevented from being transferred to the insulating film, and the contact hole can be buried with the metal plug having a smooth surface.

In addition, when the contact hole is formed in a tapered shape, a tapered recessed portion can be formed in the metal film in the contact hole. For this reason, when a brittle seam is formed such that metal layer portions formed from the bottom surface and side surface of the contact hole are brought into contact with each other, the tapered recessed portion is formed on the seam to bury the tapered recessed portion with a thick smoothing layer. Even when the metal layer has a thickness such that metal film portions are not brought into contact with each other, the tapered recessed portion can easily be buried with the smoothing layer.

Therefore, in etching the smoothing layer and the metal film, the brittle seam portion of the metal film can be prevented from being etched at an excessively high rate, and the tapered recessed portion of the metal film can be prevented from being further etched, thereby preventing the recessed portion from being formed in the metal film in the contact hole.

The wafer processing apparatus according to the present invention comprises the organic polymer layer forming unit and the heating unit. For this reason, the formation of the organic polymer layer and smoothing of the organic polymer layer performed by fluidization can be continuously performed.

In the method of forming a metal plug according to the present invention, the first etching is performed by a radical reaction as etching to the deposited metal film. The first etching has a high etching rate.

When the second etching in which the deposition and etching reactions of the metal film are competitive reactions is performed after the first etching is performed, the overetching of the metal film can easily be controlled because a loading effect is small in the second etching. In addition, even when the surface of the metal layer has an uneven shape at the time the metal layer is deposited on the insulating film, the surface of the metal film can be smoothed with a deposition component. For this reason, the uneven shape of the surface of the metal film at the time the metal film is deposited can be prevented from being transferred to the insulating film, and the contact hole can be buried with a metal plug having a smooth surface.

DETAILED DESCRIPTION OF THE PREFERRED EMBODIMENTS

Figure 1A:
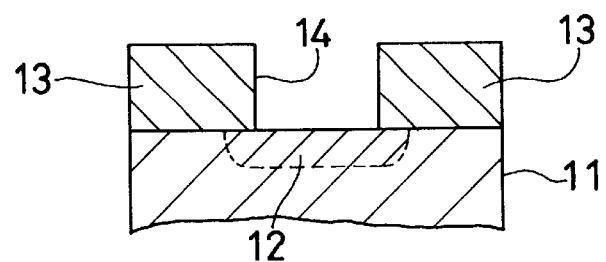
FIGS. 1A to 1C are cross sectional views showing the prior art in order of steps.

The first to eighth embodiments of the present invention will be described below with reference to FIGS. 2A to 8C. Note that the same reference numerals as in the prior art in FIGS. 1A to 1C denote the same constituent parts in FIGS. 2A to 8C.

Figure 1B:
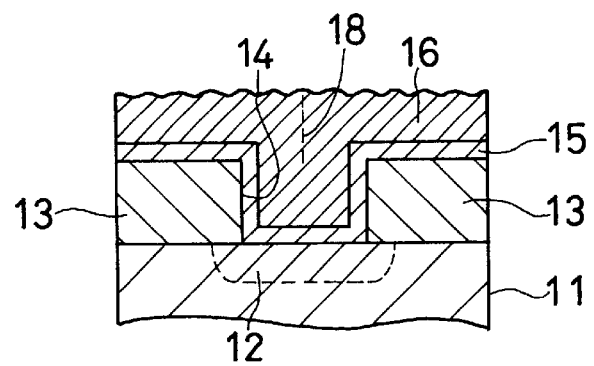
Figure 1C:
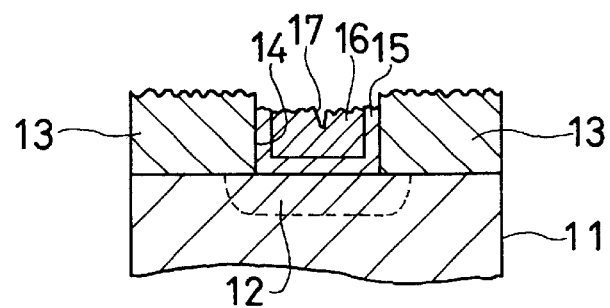
Figure 2A:
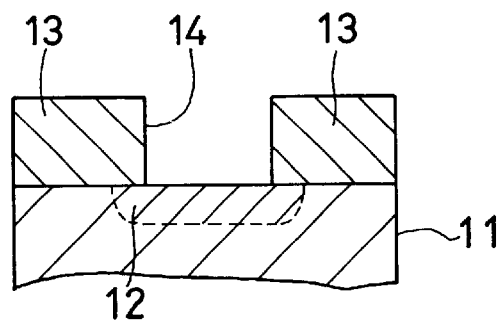
FIGS. 2A to 2C are cross sectional views showing the first and second embodiments of the present invention in order of steps.
Figure 2B:
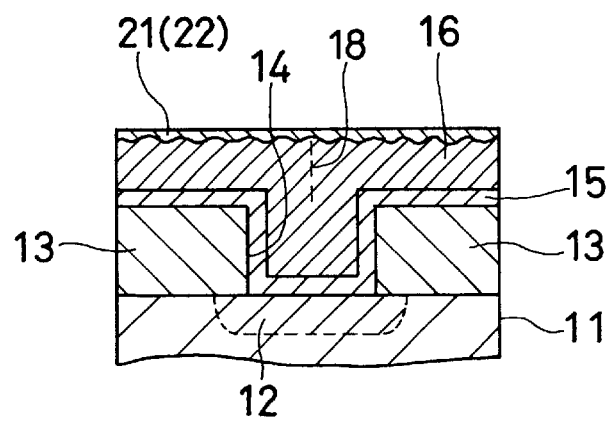
Figure 2C:
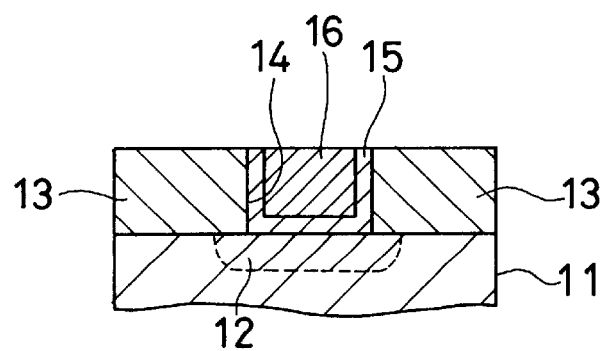

FIGS. 2A to 2C show the first embodiment. In the first embodiment, as shown in FIGS. 2A and 2B, the steps which are substantially the same as those of the prior art shown in FIGS. 1A to 1C are performed up to deposition of a W film 16. However, in the first embodiment, a W film 21 is then deposited on the W film 16 by bias-sputtering, as shown in FIG. 2B.

In order to perform this bias-sputtering, in an ECR apparatus, discharge is performed at a reaction gas flow rate of $WF_6/SiH_4/H_2/Ar = 20/30/100/50$ SCCM, a reaction pressure of 0.7 mTorr, a microwave power of 1 kW, an RF bias of 30 W and a magnetic field of 875 Gauss. As a result, the W film 21 is smoothly formed by competitive reactions as an ion-sputter etching reaction and a deposition reaction, and the uneven surface of the W film 16 is smoothly buried or covered.

The W films 21 and 16 and a TiON layer 15 are etched back in the same chamber as that in which the bias-sputtering has been performed. This etch-back operation is performed at a reaction gas flow rate of $SF_6/Cl_2 = 20/20$ SCCM, a reaction pressure of 5 mTorr, a microwave power of 1 kW, an RF bias of 30 W and a magnetic field of 875 Gauss.

In this case, since the etching mainly having an ion reaction is performed, the etch-back operation is advanced while the smooth surface of the W film 21 is kept. As a result, an $SiO_2$ film 13 is uniformly exposed, as shown in FIG. 2C, the uneven shape of the surface of the W film 16 at the time the W film 16 is deposited is not transferred to the $SiO_2$ film 13, and a contact hole 14 is provided or buried with the W film 16 having a smooth surface.

The etch-back operation is performed in the same chamber as that in which the bias-sputtering has been performed. For this reason, even when the W film 21 is deposited on a portion other than the wafer in the chamber, the W film 21 deposited on the portion is removed simultaneously with the W film 21 from the wafer. Therefore, no deposit is accumulated in the chamber, and the etch-back operation also has a cleaning effect.

The second embodiment will be described below with reference to FIGS. 2A to 2C. In the second embodiment, the steps which are substantially the same as those of the first embodiment are performed except that an $SiN_x$ film 22 (x=1 to 2) is used in place of a W film 21 in FIG. 2B. That is, after a W film 16 is deposited, processing in an RIE apparatus is performed at a reaction gas flow rate of $SiCl_4/N_2$=10/50 SCCM, a reaction pressure of 50 mTorr and an RF power of 300 W.

As a result, the $SiN_x$ film 22 is deposited on the W film 16 by a reaction between $SiCl_4$ and $N_2$. At this time, the $SiN_x$ film 22 is smoothly formed by competitive reactions as an ion-sputter etching reaction and a deposition reaction, and the uneven surface of the W film 16 is smoothly covered or buried.

The $SiN_x$ film 22, the W film 16 and a TiON layer 15 are etched back in the same chamber as that in which RIE has been performed. This etch-back operation is performed at a reaction gas flow rate of $SF_6/Cl_2$=10/30 SCCM, a reaction pressure of 20 mTorr and an RF power of 300 W.

At this time, although the etching rates of the $SiN_x$ film 22 and the W film 16 are set to be equal to each other, this can be realized by adjusting a ratio of the flow rate of $SF_6$ to the flow rate of $Cl_2$. Under the above conditions, the etching rates of the $SiN_x$ film 22 and the W film 16 are set to be equal to each other.

For this reason, an etch-back operation is started from the $SiN_x$ film 22 having a smooth surface, and the shape of the smooth surface of the $SiN_x$ film 22 is transferred to the W film 16, thereby smoothing the surface of the W film 16 during the etch-back operation. As a result, an $SiO_2$ film 13 is uniformly exposed, and as shown in FIG. 2C, the uneven shape of the surface of the W film 16 at the time the W film 16 is deposited is not transferred to the $SiO_2$ film 13, and a contact hole 14 is provided or buried with the W film 16 having the smooth surface.

In the second embodiment, the etch-back operation is performed in the same chamber as that in which the RIE for depositing the $SiN_x$ film 22 has been performed. For this reason, even when the $SiN_x$ film 22 is deposited on a portion other than a wafer in the chamber, the $SiN_x$ film 22 deposited on the portion is etched back simultaneously with the $SiN_x$ film 22 deposited on the wafer. Therefore, no deposit is accumulated in the chamber, and the etch-back operation also has a cleaning effect.

In each of the first and second embodiments, the W film 21 or the $SiN_x$ film 22 is smoothly formed by competitive reactions as etching and deposition reactions. Materials other than W and $SiN_x$ may be used, when the materials can be used for the competitive reactions as the etching and deposition reactions.

As the above materials, elements such as W, Mo, Si, Al and S, oxides and nitrides such as $WN_2$, $WO_2$ and $SiO_2$ of these elements, $WCl_x$ (x=4 to 5) and $MoCl_6$ which are halides of these elements and the like are known.

Figure 3A:
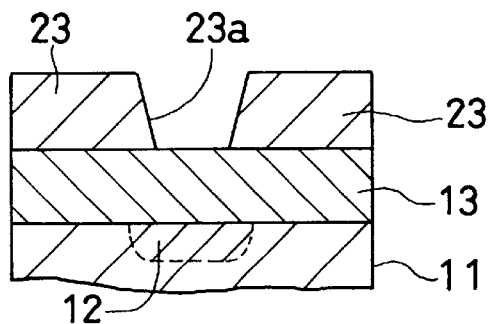
FIGS. 3A to 3E are cross sectional views showing the third embodiment of the present invention in order of steps.

FIGS. 3A to 3E show the third embodiment. In the third embodiment, the steps which are substantially the same as those of the prior art shown in FIGS. 1A to 1C until a resist film 23 having an opening 23a corresponding to a contact hole 14 is formed on an $SiO_2$ film 13 by photolithography. However, in the third embodiment, annealing is then performed at a temperature of, e.g, 140° C., for 10 minutes to make the opening 23a be tapered as shown in FIG. 3A.

Figure 3B:
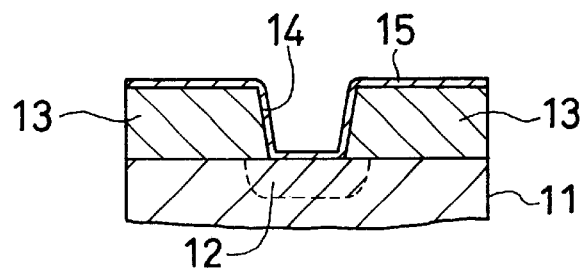

Etching is performed using the resist film 23 as a mask under the same conditions as those of the prior art to form the contact hole 14 in the $SiO_2$ film 13 as shown in FIG. 3B. At this time, the contact hole 14 is formed to have a tapered shape because the opening 23a is tapered. Thereafter, the same steps as those of the prior art are performed to form a TiON layer 15. The step coverage of the TiON layer 15 is better than that of the prior art because the contact hole 14 is formed to have a tapered shape.

Figure 3C:
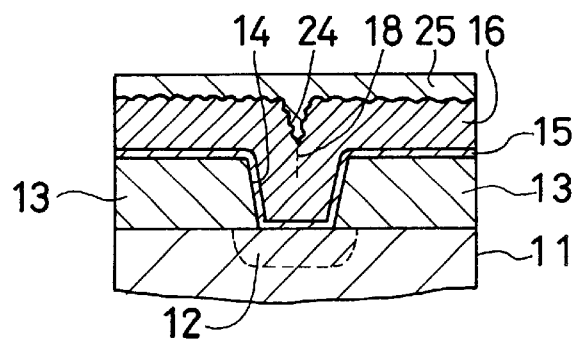

The same steps as those of the prior art are performed to deposit a W film 16 on the entire surface of the resultant structure, as shown in FIG. 3C. In the third embodiment, although a seam 18 is formed at the central portion of the W film 16 in the contact hole 14, a tapered recessed portion 24 is formed above the seam 18. Therefore, a resist film 25 is subsequently coated on the entire surface of the resultant structure, and the recessed portion 24 is buried with the thick resist film 25.

Figure 3D:
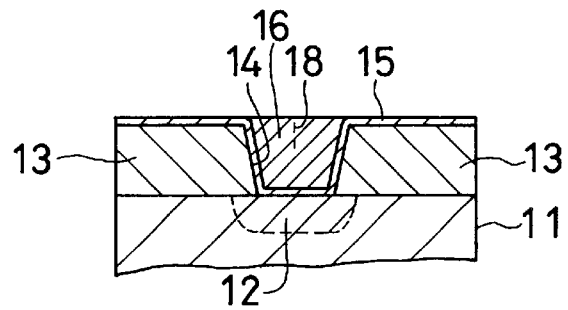

As shown in FIG. 3D, the etching rate of the resist film 25 and the etching rate of the W film 16 are set to be equal to each other, and these films are etched back in an RIE apparatus to expose a TiON layer 15. This etch-back operation is performed at a reaction gas flow rate of $SF_6/N_2$=50/10 SCCM, a reaction pressure of 10 mTorr and an RF power of 300 W.

At this time, the resist film 25 is coated thick on the recessed portion 24 above the seam 18 which is a brittle portion of the W film 16. For this reason, the time for exposing the seam 18 in a plasma to etch the seam 18 is short. Therefore, a recessed portion 17 can be prevented from being formed at the central portion of the W film 16 in the contact hole 14 as in the prior art shown in FIG. 1C.

Figure 3E:
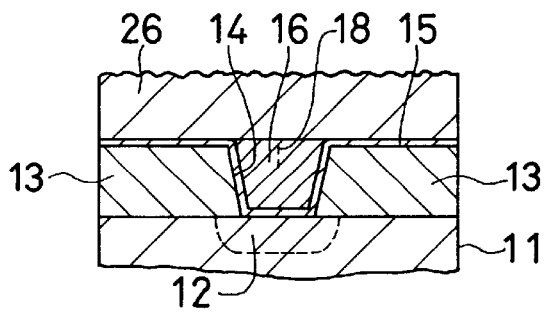

A Ti film having a thickness of 100 nm and an Al—Si film containing 1% of Si and having a thickness of 1 μm are sequentially stacked on the resultant structure, and these films are patterned to form a wiring layer 26, as shown in FIG. 3E. In this case, the recessed portion 17 is not formed in the W film 16, and the surface of the W film 16 is smoothed. For this reason, the wiring layer 26 can be preferably in electrical contact with the W film 16. In the third embodiment, although the resist film 25 is coated on the W film 16, another organic film may be used in place of the resist film 25.

Figure 4A:
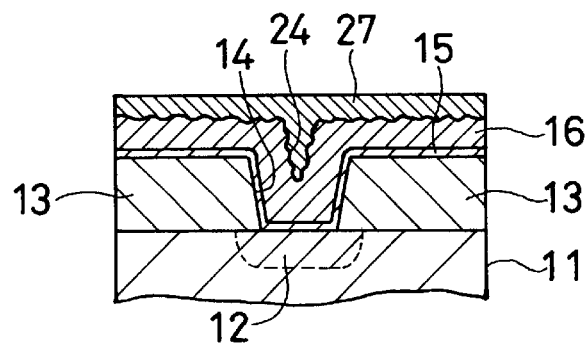
FIGS. 4A to 4C are cross sectional views showing the fourth embodiment of the present invention in order of steps.
Figure 4B:
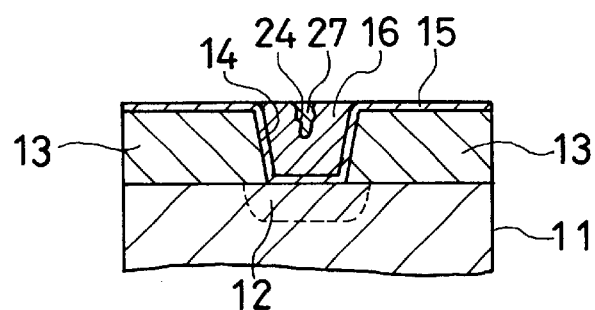
Figure 4C:
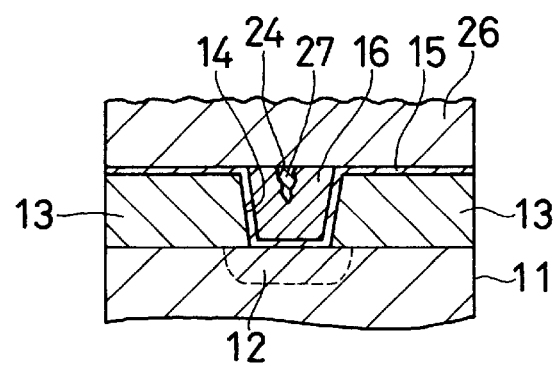

FIG. 4A to 4C show the fourth embodiment. In the fourth embodiment, the steps which are substantially the same as those of the third embodiment shown in FIG. 3A to 3E are performed until a TiON layer 15 is formed. In the fourth embodiment, however, when a W film 16 is to be formed on the entire surface of the resultant structure, as shown in FIG. 4A, the thickness of the W film 16 is determined not to form a seam 18. For this reason, a tapered recessed portion 24 of the W film 16 is deeper than that in the third embodiment, and the bottom portion of the recessed portion 24 is located in a contact hole 14.

Thereafter, although an SOG film 27 is to be coated on the entire surface of the resultant structure, the recessed portion 24 can easily be filled or buried with the SOG film 27 because the recessed portion 24 has a tapered shape, and the surface of the SOG film 27 is smoothed. Annealing is performed at a temperature of, e.g., 400° C., for 30 minutes to inorganize the SOG film 27.

As shown in FIG. 4B, the etching rates of the SOG film 27 and the W film 16 films are set to be equal to each other, and the SOG film 27 and the W film 16 are etched back to expose the TiON layer 15. This etch-back operation is performed at a reaction gas flow rate of $CHF_3/O_2=50/30$ SCCM, a reaction pressure of 10 mTorr and an RF power of 300 W.

As described above, since the etch-back operation is performed such that the etching rates of the SOG film 27 and the W film 16 are set to be equal to each other, a plug constituted by the W film 16 is formed in the contact hole 14 while the SOG film 27 is left in the recessed portion 24. In this case, the recessed portion 24 is not further etched because the SOG film 27 is left in the recessed portion 24.

Note that the etching rates of the SOG film 27 and the W film 16 can easily be adjusted by changing the etching conditions. For this reason, the thickness of the SOG film 27 left in the recessed portion 24 can easily be controlled.

As shown in FIG. 4C, a wiring layer 26 is formed while the SOG film 27 is left in the recessed portion 24. Therefore, in the fourth embodiment, the wiring layer 26 can be in proper electrical contact with the W film 16 because the surfaces of the W film 16 and the recessed portion 17 are smoothed.

In the fourth embodiment, although the SOG film 27 is formed on the W film 16, an $SiO_2$ or polysilicon film containing no impurity or an $SiO_2$ or polysilicon film containing at least one of P, B, As or the like may be used in place of the SOG film 27.

Figure 5A:
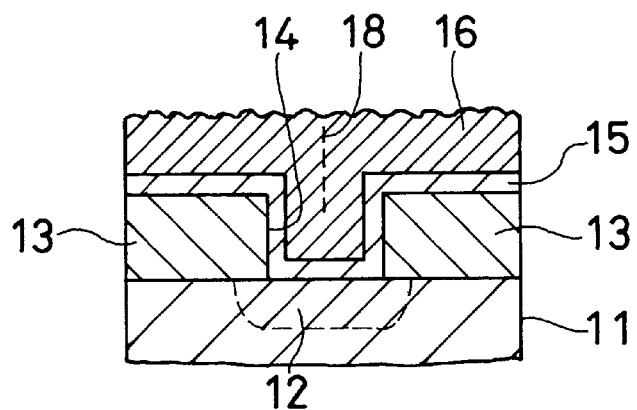
FIGS. 5A to 5C are cross sectional views showing the fifth embodiment of the present invention in order of steps.
Figure 5B:
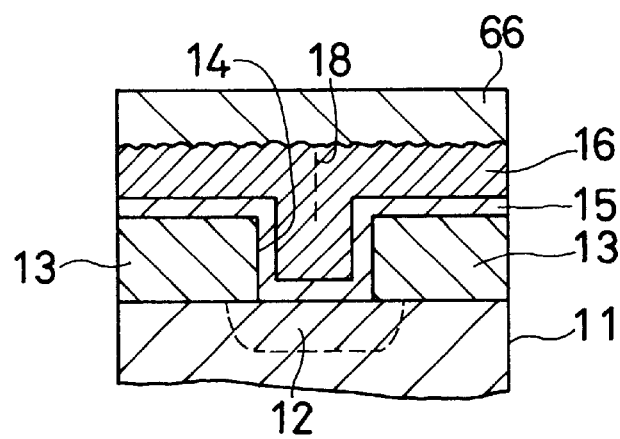
Figure 5C:
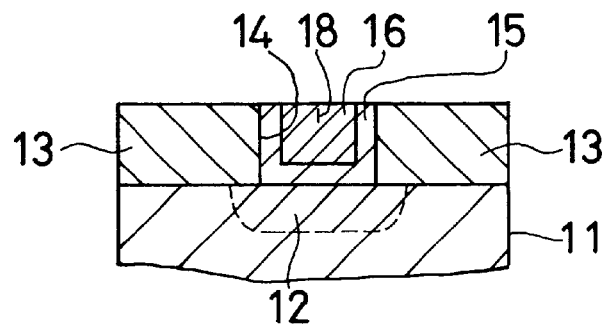
Figure 6A:
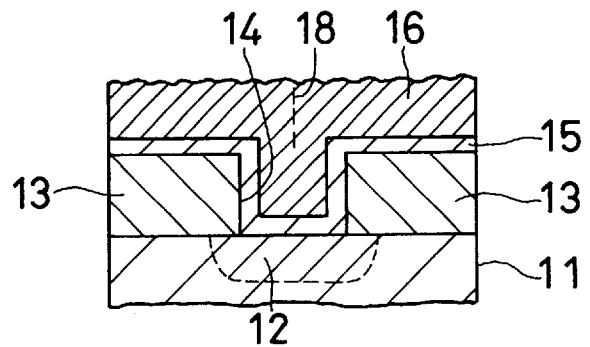
FIGS. 6A to 6D are cross sectional views showing the sixth embodiment of the present invention in order of steps.
Figure 6B:
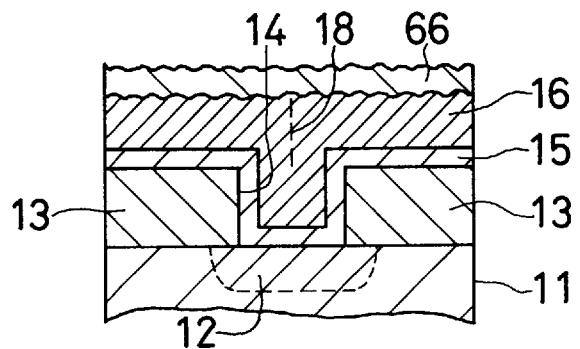
Figure 6C:
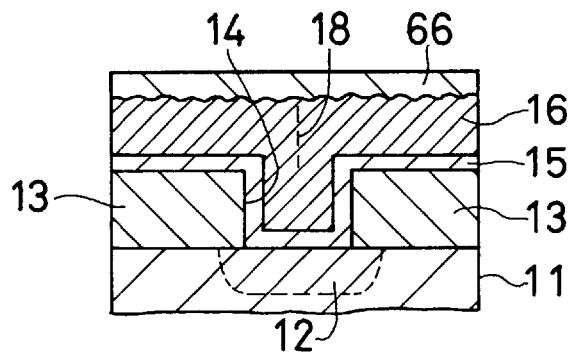
Figure 6D:
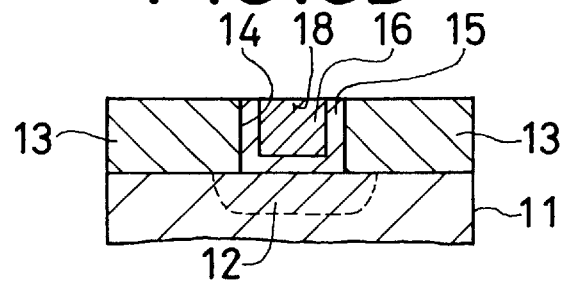
Figure 7:
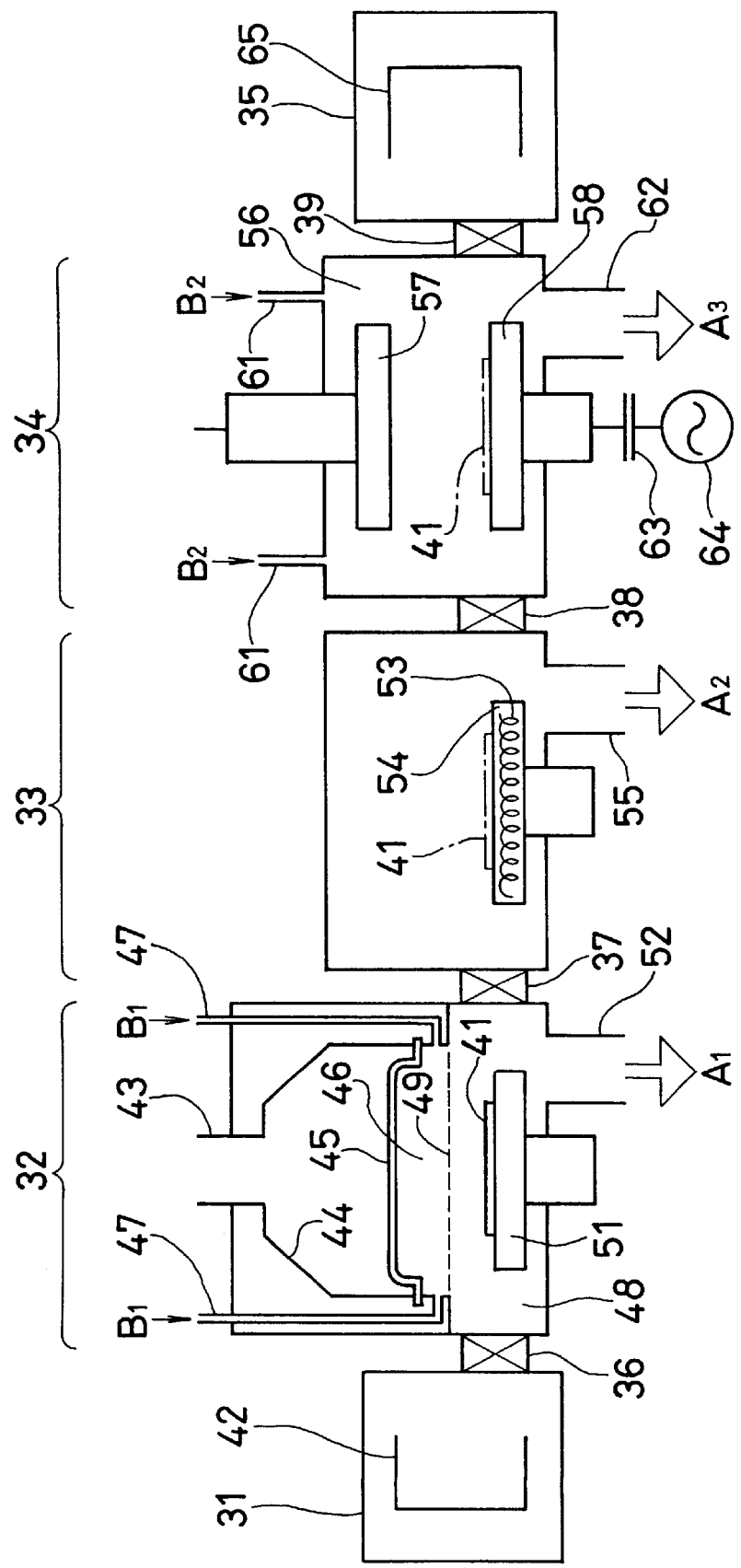
FIG. 7 is a schematic cross sectional view showing a wafer processing apparatus used in the fifth and sixth embodiments shown in FIGS. 5A to 6D.

FIGS. 5A to 5C and FIGS. 6A to 6D show the fifth and sixth embodiments. FIG. 7 shows a wafer processing apparatus used in the fifth and sixth embodiments. Prior to a description of the fifth and sixth embodiments, the wafer processing apparatus shown in FIG. 7 will be described below.

In the wafer processing apparatus, a loading chamber 31, a down-flow type plasma processing chamber 32, an annealing chamber 33, a parallel-plate type RIE apparatus 34, and an unloading chamber 35 are connected in series with gate valves 36 to 39, and wafers are conveyed between the processing chambers in a vacuum state.

The loading chamber 31 comprises a wafer convey mechanism (not shown) and a loading cassette 42 for storing a plurality of wafers 41 at a time.

In a down-flow type plasma processing chamber 32, a microwave generated by a microwave oscillator (not shown) is guided by a rectangular waveguide 43 and a circular waveguide 44 to be supplied to a plasma producing chamber 46 through a microwave-receiving window 45. A deposition gas is supplied into the plasma producing chamber 46 from a direction of an arrow $B_1$ through a gas supply tube 47. The deposition gas is decomposed by microwave discharge to produce a plasma, and organic polymer is formed by using the plasma.

A processing chamber 48 for performing predetermined processing to each of the wafers 41 is connected to the plasma producing chamber 46 through a mesh electrode 49. The mesh electrode 49 is arranged to trap charged particles in the plasma. Therefore, only neutral active species such as radicals flow downward to be extracted into the processing chamber 48, such that processing having a small damage can be performed.

The processing chamber 48 incorporates a wafer stage 51, and is evacuated to a high degree of vacuum by a vacuum system (not shown) through an exhaust port 52 in a direction of an arrow $A_1$. Each of the wafers 41 is placed on the wafer stage 51 so as to oppose the mesh electrode 49. The processing chamber 48 is connected to the loading chamber 31 through the gate valve 36.

The annealing chamber 33 connected to the plasma processing chamber 32 through the gate valve 37 incorporates a heater 53 and stores a wafer stage 54 on which each of the wafers 41 is placed. The annealing chamber 33 is evacuated to a high degree of vacuum in a direction of an arrow $A_2$ by a vacuum system (not shown) through an exhaust port 55.

An etching chamber 56 of the parallel-plate type RIE apparatus 34 is connected to the annealing chamber 33 through the gate valve 38. An upper electrode 57 and a wafer placing electrode 58 are arranged to be opposite to each other in the etching chamber 56, an RF electric field is applied across the electrodes 57 and 58, and a metal film on the wafer 41 is etched by using a plasma produced by the RF discharge.

For this reason, a gas supply tube 61 for supplying a reaction gas from a direction of an arrow $B_2$ is arranged in the ceiling portion of the etching chamber 56. An exhaust port 62 for exhausting the gas in the etching chamber 56 in a direction of an arrow $A_3$ to remove reaction products produced by processing is arranged in the bottom portion of the etching chamber 56.

An RF power supply 64 is connected to the wafer placing electrode 58 through a blocking capacitor 63 for blocking a DC component, thereby obtaining a cathode-coupling structure.

The unloading chamber 35 connected to the RIE apparatus 34 through the gate valve 39 comprises a wafer convey mechanism (not shown) and an unloading cassette 65 for storing the plurality of wafers 41 at a time.

The fifth embodiment will be described below. In the fifth embodiment, prior to processing performed by the above wafer processing apparatus, as shown in FIG. 5A, the steps up to the deposition of a W film 16 is performed. Up to the deposition of the W film 16, the steps which are substantially the same as those of the prior art shown in FIGS. 1A to 1C are performed. Each of wafers 41 subjected to the above processing is loaded in the loading cassette 42 and conveyed from the loading chamber 31 to the plasma processing chamber 32.

In the plasma processing chamber 32, processing is performed for 4 minutes at a reaction gas ($CHF_3$) flow rate of 80 SCCM, a reaction pressure 0.8 Torr and a microwave current of 400 mA, and a CF-based organic polymer film 66 containing C and F and having a thickness of about 400 nm is formed on the W film 16, as shown in FIG. 5B. The organic polymer layer 66 has a thickness larger than the undulation of the uneven portion of the surface of the W film 16, thereby smoothing the surface of the organic polymer layer 66.

Thereafter, the wafer 41 is conveyed to the RIE apparatus 34, and the wafer 41 is etched back at a reaction gas flow rate of $SF_6/O_2=50/10$ SCCM, a reaction pressure of 20 mTorr and an RF power of 200 W. Under these conditions, the etching rates of the organic polymer layer 66 and the W film 16 are equal to each other, and the smooth surface shape of the organic polymer layer 66 is transferred to the W film 16.

For this reason, the etch-back operation is performed while the uneven surface of the W film 16 is not present, and even when an $SiO_2$ film 13 is exposed, the uneven shape of the surface of the W film 16 at the time the W film 16 is deposited is not transferred to the $SiO_2$ film 13. Therefore, as shown in FIG. 5C, the etch-back operation can be finished while the SiO$_2$ film 13 has a smooth surface. Thereafter, the wafer 41 is conveyed into the unloading chamber 35.

The sixth embodiment will be described below. In the sixth embodiment, as shown in FIGS. 6A and 6B, the steps which are substantially the same as those of the fifth embodiment in FIG. 5A to 5C are performed until an organic polymer layer 66 is formed. However, since the time for forming the organic polymer layer 66 is set to be 1 minute, the thickness of the organic polymer layer 66 is decreased to about 100 nm. For this reason, the organic polymer layer 66 is influenced by the uneven surface of a W film 16, and the surface of the organic polymer layer 66 becomes uneven.

Thereafter, the wafer 41 is conveyed into the annealing chamber 33, and the wafer 41 is annealed at a temperature of 180° C. for 2 minutes. As a result, the organic polymer layer 66 is fluidized to smooth its surface, as shown in FIG. 6C. In this state, the wafer 41 is conveyed into the RIE apparatus 34, and the same steps as those of the fifth embodiment are performed to etch back the organic polymer layer 66 and the W film 16, as shown in FIG. 6D. Thereafter, the wafer 41 is conveyed into the unloading chamber 35.

In the above fifth and sixth embodiments using the wafer processing apparatus shown in FIG. 7, a series of operations can be continuously performed without exposing the wafers 41 to the atmospheric air. For this reason, in comparison with a case wherein coating an organic film, annealing, and etching back are performed in independent apparatuses, the throughput can be increased, and reliability can be improved.

In each of the fifth and sixth embodiments, although CHF$_3$ is used as a reaction gas for forming the organic polymer layer 66, a gas such as CH$_2$F$_2$, CH$_3$F, CH$_4$, CHBr$_3$, CH$_2$Br$_2$, or CH$_3$BrF containing C and H in its molecules and containing F, Br, Cl, or the like can be used as the reaction gas.

Figure 8A:
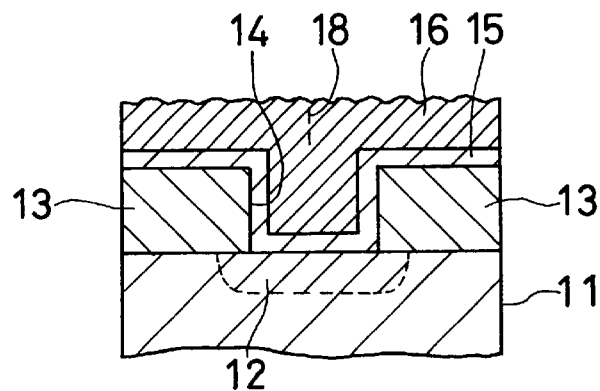
FIGS. 8A to 8C are cross sectional views showing the seventh and eighth embodiments of the present invention in order of steps.
Figure 8B:
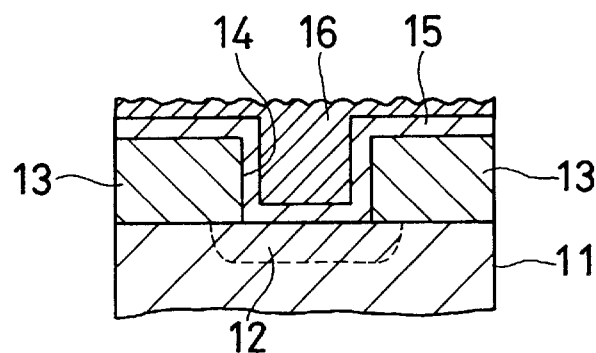
Figure 8C:
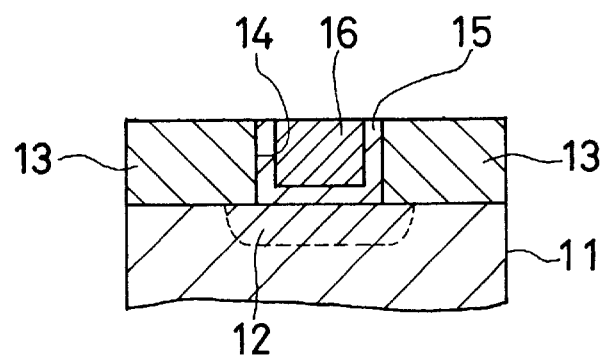

FIG. 8A to 8C show the seventh embodiment. In the seventh embodiment, as shown in FIG. 8A, the steps which are substantially the same as those of the fifth and sixth embodiments shown in FIGS. 5A to 6D are performed until a W film 16 is deposited.

In the seventh embodiment, thereafter, a microwave etching apparatus performs first-stage etching to the W film 16 at a reaction gas (SF$_6$) flow rate of 50 SCCM, a reaction pressure of 10 mTorr, a microwave current of 300 mA, and an RF bias of 30 W just before a TiON layer 15 is exposed as shown in FIG. 8B. In this first-stage etching, although WF$_6$ is produced by a reaction between the W film 16 and fluorine radicals produced by discharge, the W film 16 is processed at a high rate because WF$_6$ has a low boiling point of 17.5° C. and a high vapor pressure.

Second-stage etching is performed to the W film 16 at a reaction gas flow rate of SF$_6$/HBr=10/30 SCCM, a reaction pressure of 10 mTorr, a microwave current of 300 mA and an RF bias of 30 W. In this second-stage etching, WF$_6$ is produced by a reaction between the W film 16 and fluorine radicals, and WBr$_5$ is produced by a reaction between the W film 16 and bromine radicals. However, WBr$_5$ is easily deposited because it has a high boiling point of 333° C. and a low vapor pressure.

For this reason, although the produced WBr$_5$ is adhered on the surface of the W film 16 and then eliminated from the W film 16 by sputtering caused by incident ions, competitive deposition and etching reactions in which the removed WBr$_5$ is adhered on the W film 16 again are performed. As a result, as shown in FIGS. 8A and 8B, even when the surface of the W film 16 after the deposition of the W film 16 is performed has an uneven shape, the W film 16 is etched back while the uneven surface is shaped and smoothed, as shown in FIG. 8C. When a gas such as O$_2$ or N$_2$ containing O or N in its molecules is added, the deposition of the W film 16 in the above competitive reactions can be enhanced.

The second-stage etching to the W film 16 becomes a reaction in which sputtering is mainly performed because injection of ions for removing the WBr$_5$ adhered on the surface of the W film 16 is rate-determined, and the etching rate of the second-stage etching is lower than that of the first-stage etching in the state shown in FIG. 8B. For this reason, a loading effect is small, and over-etching can easily be controlled, thereby smoothly burying a contact hole 14 with the W film 16, as shown in FIG. 8C.

In the seventh embodiment, although SF$_6$ and HBr are used as etching gases, another gas such as NF$_3$ or ClF$_3$ containing fluorine may be used in place of the SF$_6$, and another gas such as Br$_2$ or BBr$_3$ containing bromine may be used in place of the HBr. As described above, although WBr$_5$ has a high boiling point, WCl$_5$ and WCl$_6$ also have high boiling points of 275.6° C. and 346.7° C., respectively. Therefore, a gas such as HCl, Cl$_2$ or BCl$_3$ containing chlorine may be used in place of HBr. However, when the etching gas is to be used, etching conditions must be properly changed.

The eighth embodiment will be described below with reference to FIGS. 8A to 8C. In the eighth embodiment, the same steps which are substantially the same as those of the seventh embodiment up to the state shown in FIG. 8B. In the eighth embodiment, in second stage etching from the state in FIG. 8B to the state in FIG. 8C, deposits which are to be adhered again on the surface of a W film 16 are externally supplied.

That is, the W film 16 is etched at a reaction gas flow rate of SF$_6$/WF$_6$/HBr=5/20/30 SCCM, a microwave current of 300 mA and an RF bias of 30 W. In this etching, WBr$_5$ is produced by the following reaction between W produced by decomposing WF$_6$ and Br produced by decomposing HBr:

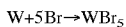

This WBr$_5$ is adhered on the surface of the W film 16.

In the above etching in the eighth embodiment, competitive reactions as deposition and etching reactions to the W film 16 are performed, and the same functional effect as described in the seventh embodiment can be obtained.

In each of the first to eighth embodiments, although the W film 16 is used for forming a plug, an Mo film, a Pt film, a Cu film, a WSi$_x$ film, an MoSi$_x$ film, an Al film or the like may be used in place of the W film 16. In this case, a reaction gas in an etch-back operation must be properly optimized.

For example, when an Al film is used to form a plug in each of the seventh and eighth embodiments, a gas mainly containing Cl is used in the first-stage etching for changing the state in FIG. 8A to the state in FIG. 8B. A gas mainly containing Br is used in the second-stage etching for changing the state in FIG. 8B to the state in FIG. 8C.

In the method of forming a metal plug according to the present invention, since the uneven shape of a metal film surface at the time the metal film is deposited can be prevented from being transferred to an insulating film, a wiring layer having high quality can be formed on the insulating film. In addition, since a contact hole can be buried or filled with the metal plug having a smooth surface, the wiring layer can be in proper electrical contact with the metal plug. Therefore, the reliability of the wiring layer itself and the contact of the wiring layer can be improved to improve the reliability of a semiconductor device.

When a contact hole is formed to have a tapered shape, a recessed portion can be prevented from being formed in the metal film in the contact hole. For this reason, the wiring layer can be more properly in electrical contact with the metal plug. Therefore, the reliability of the contact of the wiring layer can be more improved, thereby further improving the reliability of the semiconductor device.

In a wafer processing apparatus according to the present invention, formation of an organic polymer layer and smoothing of the organic polymer layer performed by fluidizing the organic polymer layer can be continuously performed. For this reason, a metal plug which can improve the reliability of the wiring layer itself and the contact of the wiring layer to improve the reliability of the semiconductor device can be formed at a high throughput.

In the method of forming a metal plug according to the present invention, when first etching performed by a radical reaction and second etching in which the deposition and etching reactions of a metal film are competitive reactions are performed, the uneven shape of the metal film surface at the time the metal film is deposited can be prevented from being transferred to the insulating film. For this reason, a wiring layer having high quality can be formed on the insulating film. And since the contact hole can be buried with the metal plug having a smooth surface, the wiring layer can be in proper electrical contact with the metal plug.

In addition, the etching rate of the first etching is high. For this reason, a metal plug which can improve the reliability of the wiring layer itself and the contact of the wiring layer to improve the reliability of a semiconductor device can be formed at a high throughput.

What is claimed is:

1. A method of forming a metal plug, comprising the steps of:

forming a contact opening in an insulating film;

depositing a first film on said insulating film and in the contact opening;

depositing a second metal film with a rough surface on said first film;

forming a smoothing layer on said second metal film;

performing a first etching to an entire surface of said first and second films by a radical reaction to remove any portion of the films outside of said contact opening; and then performing a second etching in which a deposition reaction and an etching reaction of said first and second films are competitive reactions to form a metal plug with a smooth surface in said contact opening from said first and second films in the opening.

2. A method according to claim 1, wherein a fluorine compound is used as a reaction gas for the first etching, and a chlorine compound, a bromine compound, or a halide for forming said metal film is used as a reaction gas for the second etching.

3. A method according to claim 2, wherein the fluorine compound is one compound selected from the group consisting of $SF_6$, $NF_3$ and $ClF_3$.

4. A method according to claim 2, wherein the chlorine compound is one compound selected from the group consisting of $HCl$, $Cl_2$ and $BCl_3$.

5. A method according to claim 2, wherein the bromine compound is one compound selected from the group consisting of $HBr$, $Br_2$ and $BBr_3$.

6. A method according to claim 1, wherein a gas containing oxygen atoms or nitrogen atoms as a constituent element thereof is added as a gas for said second etching.

7. A method according to claim 6, wherein the gas containing oxygen atoms or nitrogen atoms as a constituent element is oxygen or nitrogen gas.

8. A method according to claim 1, wherein the etching reaction is an ion-sputter etching reaction and the deposition reaction is a bias-sputtering deposition reaction preformed in an ECR apparatus.

9. A method according to claim 1, wherein the first film comprises TiON.

* * * * *